United States Patent
Kell et al.

(10) Patent No.: US 11,472,980 B2
(45) Date of Patent: Oct. 18, 2022

(54) MOLECULAR INK WITH IMPROVED THERMAL STABILITY

(71) Applicant: National Research Council of Canada, Ottawa (CA)

(72) Inventors: Arnold J. Kell, Ottawa (CA); Chantal Paquet, Ottawa (CA); Olga Mozenson, Ottawa (CA); Patrick Roland Lucien Malenfant, Ottawa (CA); Bhavana Deore, Ottawa (CA)

(73) Assignee: National Research Council of Canada, Ottawa (CA)

( * ) Notice: Subject to any disclaimer, the term of this patent is extended or adjusted under 35 U.S.C. 154(b) by 5 days.

(21) Appl. No.: 16/483,262

(22) PCT Filed: Feb. 8, 2018

(86) PCT No.: PCT/IB2018/050789
§ 371 (c)(1),
(2) Date: Aug. 2, 2019

(87) PCT Pub. No.: WO2018/146617
PCT Pub. Date: Aug. 16, 2018

(65) Prior Publication Data
US 2020/0010706 A1    Jan. 9, 2020

Related U.S. Application Data

(60) Provisional application No. 62/456,300, filed on Feb. 8, 2017.

(51) Int. Cl.
*C09D 11/52* (2014.01)
*B41M 1/12* (2006.01)
(Continued)

(52) U.S. Cl.
CPC ............... *C09D 11/52* (2013.01); *B41M 1/12* (2013.01); *C09D 11/033* (2013.01);
(Continued)

(58) Field of Classification Search
None
See application file for complete search history.

(56) References Cited

U.S. PATENT DOCUMENTS 3,228,897 A    1/1966    Nellessen et al.
3,702,259 A    11/1972   Nielsen
(Continued)

FOREIGN PATENT DOCUMENTS

CA    2017808 A1    12/1990
CN    1071182 A     4/1993
(Continued)

OTHER PUBLICATIONS

Stay D, et al. Macromolecules. 2013, 46, 4361-4369.
(Continued)

*Primary Examiner* — Joshua D Zimmerman
(74) *Attorney, Agent, or Firm* — Brunet & Co. Ltd.; Hans Koenig; Robert Brunet

(57) ABSTRACT

A molecular ink contains a silver carboxylate (e.g. silver neodecanoate), a solvent (e.g. terpineol) and a polymeric binder comprising a polyester, polyimide, polyether imide or any mixture thereof having functional groups that render the polymeric binder compatible with the solvent. Such an ink may have good thermal stability with higher silver carboxylate content.

17 Claims, 7 Drawing Sheets

(51) Int. Cl.
*C09D 11/033* (2014.01)
*C09D 11/037* (2014.01)
*C09D 11/104* (2014.01)
*H05K 1/09* (2006.01)
*H05K 3/12* (2006.01)

(52) U.S. Cl.
CPC .......... *C09D 11/037* (2013.01); *C09D 11/104* (2013.01); *H05K 1/097* (2013.01); *H05K 3/1216* (2013.01); *H05K 3/1283* (2013.01); *H05K 2201/0257* (2013.01); *H05K 2203/1131* (2013.01); *H05K 2203/1136* (2013.01)

(56) References Cited

U.S. PATENT DOCUMENTS

| | | |
|---|---|---|
| 3,729,339 A | 4/1973 | Kiel |
| 3,989,644 A | 11/1976 | Bolon et al. |
| 4,088,801 A | 5/1978 | Bolon et al. |
| 4,099,376 A | 7/1978 | Japs |
| 4,180,407 A | 12/1979 | Gibson et al. |
| 4,248,921 A | 2/1981 | Steigerwald et al. |
| 4,396,666 A | 8/1983 | Ernsberger |
| 4,487,811 A | 12/1984 | Eichelberger et al. |
| 4,552,690 A | 11/1985 | Nobuyuki et al. |
| 4,687,597 A | 8/1987 | Siuta |
| 4,775,594 A | 10/1988 | Desjarlais |
| 4,857,111 A | 8/1989 | Haubennestel et al. |
| 5,045,236 A | 9/1991 | Tsunaga et al. |
| 5,074,978 A * | 12/1991 | Debroy ................ C09D 163/00 106/287.22 |
| 5,248,451 A | 9/1993 | Tsunaga et al. |
| 5,306,590 A | 4/1994 | Felder |
| 5,900,327 A | 5/1999 | Pei et al. |
| 5,960,251 A | 9/1999 | Brusic et al. |
| 5,980,622 A | 11/1999 | Byers |
| 5,989,700 A | 11/1999 | Krivopal |
| 6,036,889 A | 3/2000 | Kydd |
| 6,048,389 A | 4/2000 | Price et al. |
| 6,090,890 A | 7/2000 | Murakami et al. |
| 6,521,032 B1 | 2/2003 | Lehmann et al. |
| 6,663,799 B2 | 12/2003 | Kokubo et al. |
| 6,770,122 B2 | 8/2004 | Thompson |
| 7,115,218 B2 | 10/2006 | Kydd et al. |
| 7,141,104 B2 | 11/2006 | De Voeght et al. |
| 7,211,205 B2 | 5/2007 | Conaghan et al. |
| 7,473,307 B2 | 1/2009 | Song et al. |
| 7,566,357 B2 | 7/2009 | Zhao |
| 7,629,017 B2 | 12/2009 | Kodas et al. |
| 7,683,107 B2 | 3/2010 | Yang |
| 7,691,664 B2 | 4/2010 | Kodas et al. |
| 7,731,812 B2 | 6/2010 | Wang et al. |
| 7,960,037 B2 | 6/2011 | Liu et al. |
| 7,976,737 B2 | 7/2011 | Heo et al. |
| 8,043,535 B2 | 10/2011 | Kamikoriyama et al. |
| 8,262,894 B2 | 9/2012 | Xu et al. |
| 8,282,860 B2 | 10/2012 | Chung et al. |
| 8,339,040 B2 | 12/2012 | Bruton et al. |
| 8,597,397 B2 | 12/2013 | Kunze et al. |
| 8,945,328 B2 | 2/2015 | Longinotti-Buitoni et al. |
| 8,948,839 B1 | 2/2015 | Longinotti-Buitoni et al. |
| 9,028,599 B2 | 5/2015 | Abe |
| 9,145,503 B2 | 9/2015 | Yu et al. |
| 9,187,657 B2 | 11/2015 | Yano et al. |
| 9,198,288 B2 | 11/2015 | Wu et al. |
| 9,283,618 B2 | 3/2016 | Wu et al. |
| 9,460,824 B2 | 10/2016 | Liu et al. |
| 2003/0180451 A1 | 9/2003 | Kodas et al. |
| 2005/0070629 A1 | 3/2005 | Roberts |
| 2006/0118768 A1 | 6/2006 | Liu et al. |
| 2007/0078215 A1 | 4/2007 | Yoon et al. |
| 2007/0125989 A1 | 6/2007 | Kodas et al. |
| 2007/0154644 A1 | 7/2007 | Hwang et al. |
| 2008/0093422 A1 | 4/2008 | Kodas et al. |
| 2008/0108218 A1 | 5/2008 | Kodas et al. |
| 2008/0178761 A1 | 7/2008 | Tomotake et al. |
| 2009/0267060 A1 | 10/2009 | Forrest et al. |
| 2011/0111138 A1 | 5/2011 | McCullough et al. |
| 2012/0104330 A1 | 5/2012 | Choi et al. |
| 2013/0121872 A1 | 5/2013 | Matsumoto |
| 2013/0156971 A1 | 6/2013 | McCullough et al. |
| 2013/0161573 A1 | 6/2013 | Torardi et al. |
| 2013/0277096 A1 | 10/2013 | Seong et al. |
| 2014/0124713 A1 | 5/2014 | Majumdar et al. |
| 2014/0178601 A1 | 6/2014 | Wei et al. |
| 2014/0034901 A1 | 11/2014 | Abe |
| 2014/0349017 A1 | 11/2014 | Abe |
| 2014/0349025 A1 | 11/2014 | Hui et al. |
| 2015/0004325 A1 | 1/2015 | Walker et al. |
| 2015/0056426 A1 | 2/2015 | Grouchko et al. |
| 2015/0132476 A1* | 5/2015 | Wu ........................ C23C 18/08 427/126.1 |
| 2015/0231740 A1 | 8/2015 | Grabey et al. |
| 2015/0257279 A1 | 9/2015 | Shahbazi et al. |
| 2015/0298248 A1 | 10/2015 | Walker et al. |
| 2015/0299489 A1 | 10/2015 | Walker |
| 2016/0081189 A1 | 3/2016 | Shimoda et al. |
| 2016/0095547 A1 | 4/2016 | Wang et al. |

FOREIGN PATENT DOCUMENTS

| | | |
|---|---|---|
| CN | 101271929 A | 9/2008 |
| CN | 101519356 A | 9/2009 |
| CN | 102270514 A | 12/2011 |
| CN | 102618033 A | 8/2012 |
| CN | 102863845 A | 1/2013 |
| CN | 103063581 A | 5/2013 |
| CN | 104263082 A | 1/2015 |
| CN | 104479463 A | 4/2015 |
| CN | 106147405 A | 11/2016 |
| EP | 0335237 A2 | 10/1989 |
| EP | 2871260 A1 | 5/2015 |
| GB | 1443099 A | 7/1976 |
| JP | S61136978 A | 6/1986 |
| JP | 63278983 A | 11/1988 |
| JP | H10279868 A | 10/1998 |
| JP | 2000136333 A | 5/2000 |
| JP | 2004162110 A | 6/2004 |
| JP | 2005537386 A | 12/2005 |
| JP | 2006/519291 A | 8/2006 |
| JP | 2008013466 A | 1/2008 |
| JP | 2008031104 A | 2/2008 |
| JP | 2008/531810 A | 8/2008 |
| JP | 2009212182 A | 9/2009 |
| JP | 2009256218 A | 11/2009 |
| JP | 20100018696 A | 1/2010 |
| JP | 2012234803 A | 11/2012 |
| JP | 2014148732 A | 8/2014 |
| JP | 2014182913 A | 9/2014 |
| JP | 2015187259 A | 10/2015 |
| KR | 2011-0002022 A | 1/2011 |
| KR | 20120132424 A | 12/2012 |
| KR | 101350507 A | 1/2014 |
| KR | 20150045605 A | 4/2015 |
| KR | 20150077676 A | 7/2015 |
| KR | 20150082133 A | 7/2015 |
| KR | 20150085332 A | 7/2015 |
| TW | 201406991 A | 2/2014 |
| TW | 201435923 A | 9/2014 |
| TW | 201437299 A | 10/2014 |
| WO | 03/032084 A2 | 4/2003 |
| WO | 2003/095701 A1 | 11/2003 |
| WO | 200416261 A | 9/2004 |
| WO | 2006/093398 A1 | 9/2006 |
| WO | 2009/036921 A1 | 3/2009 |
| WO | 2009/126918 A1 | 10/2009 |
| WO | 2010/036397 A2 | 4/2010 |
| WO | 2010/128107 A1 | 11/2010 |
| WO | 2012/014933 A2 | 2/2012 |
| WO | 2012/135551 A1 | 10/2012 |
| WO | 2012/144610 A1 | 10/2012 |
| WO | 2013/036519 A1 | 3/2013 |
| WO | 2013/073331 A1 | 5/2013 |
| WO | 2013/073349 A1 | 5/2013 |

(56) References Cited

FOREIGN PATENT DOCUMENTS

| WO | 2013/096664 | A1 | 6/2013 |
|---|---|---|---|
| WO | 2013/128449 | A2 | 9/2013 |
| WO | 2015/024115 | A1 | 2/2015 |
| WO | 2015/160938 | A1 | 10/2015 |
| WO | 2015/183679 | A1 | 12/2015 |
| WO | 2015/192248 | A1 | 12/2015 |
| WO | 2016/012753 | A1 | 1/2016 |

OTHER PUBLICATIONS

Suran S, et al. Thin Solid Films. 2016, 607, 36-42.
Szeremeta J, et al. Optical Materials. 2011, 33, 1372-1376.
Tsai C-Y, et al. Nanoscale Research Letters. 2015, 10, 357 (7 pages).
Vaseem M, et al. ACS Appl. Mater. Interfaces. 2016, 8, 177-186.
Walker SB, et al. J. Am. Chem.Soc. 2012, 134, 1419-1421.
Wang H, et al. small. 2015, 11(1), 126-133.
Yabuki A, et al. Thin Solid Films. 2011, 519, 6530-6533.
Kabuki A, et al. Materials Research Bulletin. 2012, 47, 4107-4111.
Yabuki A, et al. Synthesis of copper conductive film by low-temperature thermal decomposition of coppereaminediol complexes under an air atmosphere. Materials Chemistry and Physics. 2014, http://dx.doi.org/10.1016/j.matchemphys.2014.07.047, 1e6.
Yim C, et al. ACS Appl. Mater. Interfaces. 2016, 8, 22369-22373.
Yong Y, et al. Scientific Reports. 7, 45150, DOI: 10.1038/srep45150, 9 pages.
Zhai D, et al. Colloids and Surfaces A: Physicochem. Eng. Aspects. 2013, 424, 1-9.
Zhu X, et al. Langmuir. 2012, 28, 14461-14469.
Stranks SD, et al. Adv. Mater. 2013, 25, 4365-4371.
Search Report dated Nov. 9, 2020 on European application 18750597.9.
Araki T, et al. Langmuir. 2013, 29, 11192-11197.
Bjornholm, T et al. J. Am. Chem. Soc. 1998, 120, 7643-7644.
Chen W, et al. Journal of Electronic Materials. 2015, 44(7), 2479-2487.
Choi T-H, et al. Journal of Materials Chemistry. 2012, 22, 3624.
Chung W-H, et al. Thin Solid Films. 2015, 580, 61-70.
Curtis C, et al. NCPV Program Review Meeting Conference Paper (Lakewood Colorado). Metallizations by Direct-Write Inkjet Printing. NREL/CP-520-31020, 2001, 6 pages.
Dang Z-M, et al. Journal of Applied Polymer Science. 2012, 126, 815-821.
Dearden AL, et a. Macromol. Rapid Commun. 2005, 26, 315-318.
De Boer B, et al. Macromolecules. 2002, 35, 6883-6892.
Deore B, et al. Conference Poster. New Conductors for Advanced User Interfaces, Circuits and Devices. Canadian Society for Chemistry. 2015.
Ding J, et al. Nanoscale. 2014, 6, 2328-2339.
Dong Y, et al. Thin Solid Films. 2015, 589, 381-387.
Farraj Y, et al. Chem. Commun., 2015, 51, 1587-1590.
Gu L, et al. Applied Mechanics and Materials Online. 2013, 469, 51-54.
Henkel's Printed Electronic Inks. Product Brochure F_LR615251. 2015.
Hokita Y, et al. ACS Appl. Mater. Interfaces. 2015, 7, 19382-19389.
Hu Y, et al. 15th International Conference on Electronic Packaging Technology. 2014, 1565-1567.
Hwang J, et al. Bull. Korean Chem. Soc. 2014, 35(1), 147-150.
International Preliminary Report on Patentability for PCT/IB2018/050788 dated Jul. 24, 2018.
International Preliminary Report on Patentability for PCT/IB2018/050789 dated Jul. 23, 2018.
International Preliminary Report on Patentability for PCT/IB2018/050790 dated Jul. 17, 2018.
International Preliminary Report on Patentability for PCT/IB2018/050791 dated Jul. 25, 2018.
International Search Report for PCT/IB2018/050788 dated Jul. 24, 2018.
International Search Report for PCT/IB2018/050789 dated Jul. 23, 2018.
International Search Report for PCT/IB2018/050790 dated Jul. 17, 2018.
International Search Report for PCT/IB2018/050791 dated Jul. 25, 2018.
Jahn SF, et al. Thin Solid Films. 2010, 518, 3218-3222.
Kamyshny A, et al. The Open Applied Physics Journal. 2011, 4, 19-36.
Kawaguchi Y, et al. Journal of Coating Science and Technology. 2016, 3(2), 56-61.
Kim SJ, et al. Thin Solid Films. 2012, 520, 2731-2734.
Kim I, et al. RSC Advances. 2013, 3, 15169-15177 (with ESI).
Lee B, et al. Current Applied Physics. 2009, 9, e157-e160.
Li Y, et al. J Mater Sci: Mater Electron. 2016, 27, 11432-11438.
Li W, et al. J. Mater. Chem. C. 2016, 4, 8802-8808.
Lin H-C, et al. Microelectronic Engineering. 2009, 86, 2316-2319.
Lyons AM, et al. Abstract of J. Phys. Chem. 1991, 95(3), 1098-1105.
Malenfant PRL, et al. NRC Printable Electronics. Presentation at IDTechEx (Santa Clara 2013).
Nie X, et al. Applied Surface Science. 2012, 261, 554-560.
Pacioni NL, et al. Silver Nanoparticle Applications, Engineering Materials. (Springer International Publishing Switzerland 2015, E.I. Alarcon et al. (eds.), DOI 10.1007/978-3-319-11262-6_2) pp. 13-46.
Paquet C, et al. New Conductors for Advanced User Interfaces, Circuits and Devices. Poster Presentation at CPEIA 2015.
Park K-H, et al. J. Am. Chem. Soc. 2005, 127(26), 9330-9331.
Pham LQ, et al. Journal of Colloid and Interface Science. 2012, 365, 103-109.
Polzinger B, et al. 2011 11th IEEE International Conference on Nanotechnology. (Portland Marriott. Aug. 15-18, 2011, Portland, Oregon, USA) pp. 201-204.
Rajan K, et al. Nanotechnology, Science and Applications. 2016, 9, 1-13.
Rao RVK, et al. RSC Adv. 2015, 5, 77760-77790.
Sakamoto M, et al. Journal of Photochemistry and Photobiology C: Photochemistry Reviews. 2009, 10, 33-56.
Schulz DL, et al. Electrochemical and Solid-State Letters. 2001, 4(8), C58-C61.
Shen L, et al. Journal of Electronic Materials. 2015, 44(2), 720-724.
Shin D-Y, et al. J. Mater. Chem. 2012, 22, 11755-11764.
Shin D-H, et al. ACS Appl. Mater. Interfaces. 2014, 6, 3312-3319.
First Examination Report dated Mar. 30, 2021 on Indian application 201927032221.
First Office Action dated Dec. 2, 2021 on Japanese Patent Application 2019-563709.
First Examination Report dated Sep. 27, 2021 on Chinese Patent Application 2018800160488.
First Examination Report dated Sep. 15, 2021 on Taiwan Patent Application 107104323.
Office action dated Mar. 16, 2022 on European application 18750597.9.
Office action dated Apr. 21, 2022 on Chinese application 2018800160488.
Choi Y-H, et al. Langmuir 2015, 31, 8101-8110.
Greer JR, et al. J. Appl. Phys. 101, 103529 (2007).
Jahn SF, et al. Chem. Mater. 2010, 22, 3067-3071.
Kim J-H, et al. Adv. Mater. Interfaces 2015, 2, 1500283.
Kim K-S, et al. Journal of Nanoscience and Nanotechnology. (2011) vol. 11, 1493-1498.
Kim K-S, et al. Journal of Nanoscience and Nanotechnology. (2012) vol. 12, 5769-5773.
Moon YJ, et al. Journal of Electronic Materials. (2015) vol. 44, No. 4, 1192-1199.
Office action dated Jul. 12, 2022 on Japanese patent application 2019-563709.
Office action dated Aug. 19, 2022 on Korean application 10-2019-7026320.

\* cited by examiner

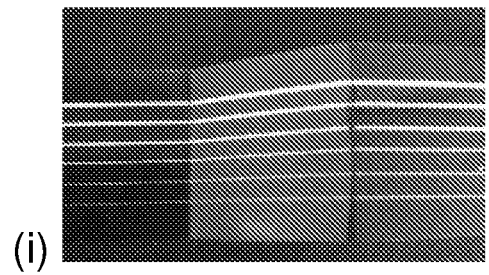
(i)
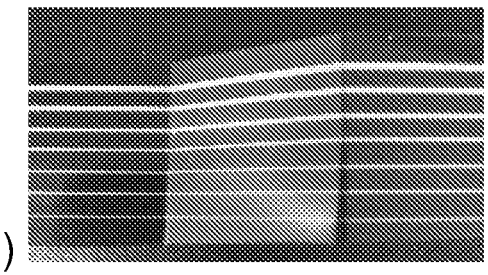
(i)
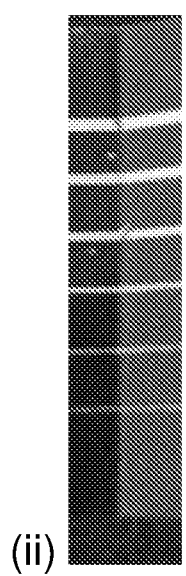
(ii) 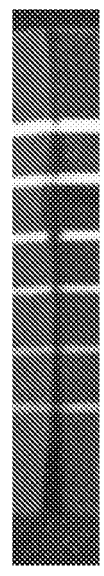 (iii)
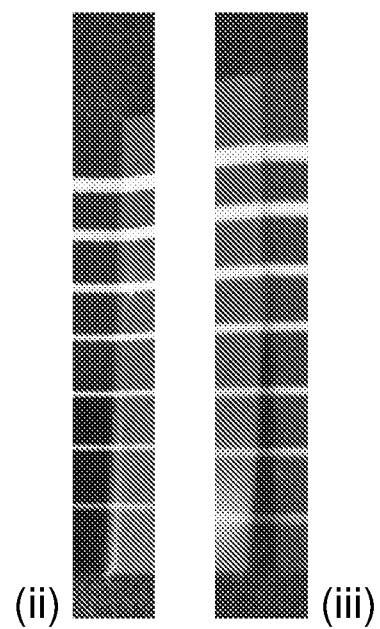
(ii) 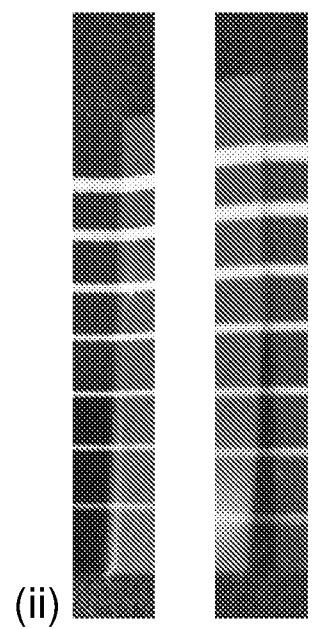 (iii)
Fig. 6A
Fig. 6B

(i)
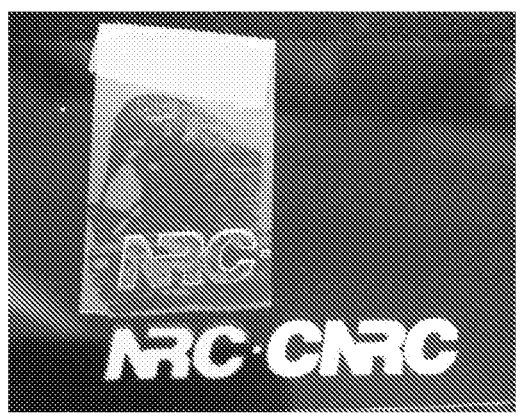
(ii)
Fig. 7A                                   Fig. 7B

MOLECULAR INK WITH IMPROVED THERMAL STABILITY

Cross-reference to Related Applications

This application is a National Entry of International Application PCT/IB2018/050789 filed Feb. 8, 2019, and claims the benefit of U.S. Provisional Application USSN 62/456,300 filed Feb. 8, 2017.

FIELD

This application relates to inks, particularly to printable molecular inks.

BACKGROUND

The mechanical properties of nanoparticle inks are typically poor. Further, the thickness of the traces can be decreased to improve the mechanical properties, but the traces derived from thinner layers of nanoparticle have lower volume resistivity values. It has been previously demonstrated that molecular inks produced with ethyl cellulose binders can have significantly enhanced mechanical properties (International Patent Publication WO 2015/192248 published Dec. 23, 2015). However, when the traces printed from this formulation are subjected to high temperatures (>230° C.) for extended periods of time (>20 minutes), mechanical failure can result (i.e. resistance change following flex or crease testing becomes greater than 10%). Such a failure could be problematic when the ink is used in multilayer processes, because the traces produced from the molecular ink printed as a first layer will have to be processed for up to 20-30 minutes at temperatures exceeding 220° C. as multiple layers are constructed in the device. Further, the narrowest traces (measured 3-5 mil linewidths) tend to sinter more quickly than the wider traces (measured 7-20 mil traces). As such, it can be difficult to fine tune processing conditions to allow for all of the traces, regardless of line width or thickness, to process under identical conditions.

With respect to such a molecular ink, decreasing sintering temperature and increasing sintering time can improve the mechanical properties of the resulting traces. However, resistivity of the traces sintered at temperatures below 200° C. can be up to 1.3 times higher than when sintered at higher temperatures (>230° C.).

Therefore, a need remains for an ink formulation that has improved thermal stability permitting sintering at high temperatures e.g. (>230° C.) and/or for longer periods of time (e.g. >20 minutes) of time while producing narrow conductive lines (e.g. <100 µm or about 4 mil) with good mechanical properties (e.g. less than 10% change in resistance following flexing and creasing according to ASTM F1683-02) and low resistivity (e.g. <5 mΩ/□/mil).

SUMMARY

A molecular silver ink with the ability to increase the loading of silver salt to 80% by weight (32% by weight silver) or more has been formulated that enables the production of traces with extraordinary thermal stability.

In one aspect, there is provided a molecular ink comprising: a silver carboxylate; a solvent; and, a polymeric binder comprising a hydroxyl- and/or carboxyl-terminated polyester.

In another aspect, there is provided a molecular ink comprising: a silver carboxylate in an amount that provides a silver loading in the ink of about 24 wt % or more, based on total weight of the ink; a solvent; and, a polymeric binder comprising a polyester, polyimide, polyether imide or any mixture thereof having functional groups that render the polymeric binder compatible with solvent.

In another aspect, there is provided a process for producing a conductive silver trace on a substrate, the process comprising depositing the molecular ink onto a substrate to form a non-conductive trace of the ink on the substrate, and sintering the non-conductive trace of the ink on the substrate to form the conductive silver trace.

In another aspect, there is provided a substrate comprising a conductive silver trace produced by a process as described above.

In another aspect, there is provided an electronic device comprising a substrate having a conductive silver trace produced by a process as described above.

Further features will be described or will become apparent in the course of the following detailed description. It should be understood that each feature described herein may be utilized in any combination with any one or more of the other described features, and that each feature does not necessarily rely on the presence of another feature except where evident to one of skill in the art.

BRIEF DESCRIPTION OF THE DRAWINGS

For clearer understanding, preferred embodiments will now be described in detail by way of example, with reference to the accompanying drawings, in which:

FIG. 6A depicts photographs showing results of a crease test on traces produced from Ink C1 following heating at 240° C. for 30 minutes.

FIG. 6B depicts photographs showing results of a crease test on traces produced from Ink I1 following heating at 240° C. for 30 minutes.

FIG. 7A depicts photographs showing results of an adhesion test using scotch tape on traces produced from Ink C1 following heating at 240° C. for 30 minutes.

FIG. 7B depicts photographs showing results of an adhesion test using scotch tape on traces produced from Ink I1 following heating at 240° C. for 30 minutes.

DETAILED DESCRIPTION

Figure 1:
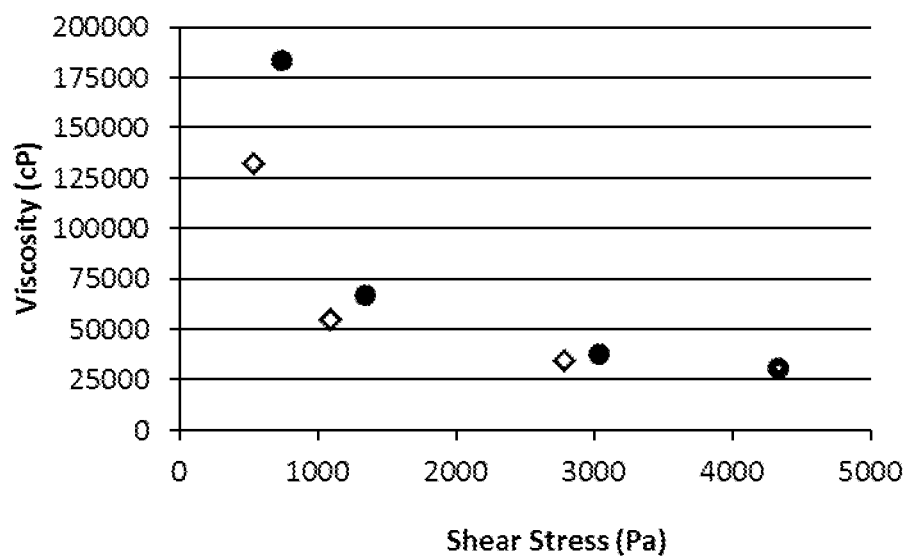
FIG. 1 depicts a graph the viscosity of the molecular ink (Ink I1) where the viscosity decreases from about 180000 to about 31000 cP as the shear stress increases from 735 to 4335 Pa (filled circles) and returns to about 130000 cP as the shear stress returns to 530 Pa (hollow diamonds).

Silver carboxylates comprise a silver ion and an organic group containing a carboxylic acid moiety. The carboxylate preferably comprises from 1 to 20 carbon atoms, more preferably from 6 to 15 carbon atoms, even more preferably from 8 to 12 carbon atoms, for example 10 carbon atoms. The carboxylate is preferably an alkanoate. The silver carboxylate is preferably a silver salt of an alkanoic acid. Some non-limiting examples of preferred silver carboxylates are silver ethylhexanoate, silver neodecanoate, silver benzoate, silver phenylacetate, silver isobutyrylacetate, silver benzoylacetate, silver oxalate, silver pivalate and derivatives thereof and any mixtures thereof. Silver neodecanoate is particularly preferred. One or more than one silver carboxylate may be in the ink. The silver carboxylate is preferably dispersed in the ink. Preferably, the ink does not contain flakes or other particles of metallic silver material.

The silver carboxylate is preferably present in the ink in an amount to provide a silver loading of about 19 wt % or more in the ink, based on total weight of the ink. More preferably, the silver carboxylate provides a silver loading of about 23 wt % or more, or about 24 wt % or more, or about 25 wt % or more, or about 27 wt % or more, or about 31 wt % or more, or about 32 wt % or more. When the silver carboxylate is silver neodecanoate, the silver neodecanoate may be preferably present in the ink in an amount of about 50 wt % or more, based on total weight of the ink, or about 60 wt % or more, or about 65 wt % or more, or about 70 wt % of more, or about 80 wt % or more.

The solvent is preferably compatible with one or both of the silver salt or polymeric binder. The solvent is preferably compatible with both the silver salt and polymeric binder. The silver salt and/or polymeric binder are preferably dispersible, for example soluble, in the solvent. The solvent is preferably an organic solvent, more preferably a non-aromatic organic solvent. Non-aromatic organic solvents include, for example, terpenes (e.g. terpene alcohols), glycol ethers (e.g. dipropylene glycol methyl ether), alcohols (e.g. methylcyclohexanols, octanols, heptanols), carbitols (e.g. 2-(2-ethoxyethoxy)ethanol) or any mixture thereof. The solvent preferably comprises a terpene, more preferably a terpene alcohol. Terpene alcohols may comprise monoterpene alcohols, sesquiterpene alcohols and the like. Monoterpene alcohols, for example terpineols, geraniol, etc., are preferred. Terpineols, for example α-terpineol, β-terpineol, γ-terpineol, and terpinen-4-ol are particularly preferred. Especially preferred is α-terpineol. The solvent may be present in the ink in any suitable amount, preferably in a range of about 1 wt % to about 50 wt %, based on total weight of the ink. More preferably, the amount is in a range of about 5 wt % to about 50 wt %, or about 10 wt % to about 40 wt %.

The polymeric binder may comprise a polyester, polyimide, polyether imide or any mixture thereof having functional groups that render the polymeric binder compatible with the solvent. Preferably, the polymeric binder is dispersible, for example soluble, in the solvent. Thus, a mixture of the polymeric binder in the solvent does not lead to significant phase separation. Functional groups that render the polymeric binder compatible with the solvent are preferably polar groups capable of participating in hydrogen bonding, for example one or more of hydroxyl, carboxyl, amino and sulfonyl groups. Preferably, the polymeric binder comprises terminal hydroxyl and/or carboxyl groups. The polymeric binder preferably comprises a polyester having functional groups that render the polyester compatible with the solvent. More preferably, the polymeric binder comprises a hydroxyl- and/or carboxyl-terminated polyester.

The polymeric binder may be present in the ink in any suitable amount, preferably in a range of about 0.1 wt % to about 5 wt %, based on total weight of the ink. More preferably, the amount is in a range of about 0.5 wt % to about 3 wt %, or about 1 wt % to about 2 wt %.

The ink with the polymeric binder enables uniform processing of narrow traces even following heating at high temperature for a long time, for example at temperatures greater than about 230° C. for at least about one hour. Further, the polymeric binder advantageously is not required to be a rheology modifier in the ink. Viscosity of the ink may be controlled by adjusting the amount of silver salt in the ink. The polymeric binder may therefore be used in lower concentration, while permitting the use of more silver salt, and therefore higher silver loading, without unduly affecting the viscosity. These properties make the ink particularly well suited for screen printing, where the application of shear stress significantly decreases the viscosity of the paste, as shown in FIG. 1. In addition, the weight ratio of silver loading to polymeric binder may be as high as 10:1 or more, or even 15:1 or more, or even 20:1 or more. The increase in silver carboxylate concentration coupled with the decrease in binder concentration leads to the production of sintered silver traces having lower resistivity values than previously demonstrated (e.g. <5 mΩ/□/mil), and the ability to print narrow features.

The described molecular ink enables the production of traces with extraordinary thermal stability, specifically, with respect to the ability to survive flex and crease testing following exposure to high temperatures for long periods of time. Preferably, the ink traces can survive flex and crease testing following exposure to temperatures greater than about 230° C. for time periods of at least about one hour. Traces produced from the molecular ink may have mechanical stability when exposed to temperatures from about 180-300° C.

In one embodiment, the molecular ink consists of a silver carboxylate, a solvent, and a polymeric binder comprising a hydroxyl- and/or carboxyl-terminated polyester. In another embodiment, the molecular ink consists of a silver carboxylate in an amount that provides a silver loading in the ink of about 24 wt % or more, based on total weight of the ink, a solvent; and a polymeric binder comprising a polyester, polyimide, polyether imide or any mixture thereof having functional groups that render the polymeric binder compatible with solvent.

The ink may be deposited on a substrate by any suitable method to form a non-conductive trace of the ink on the substrate. The ink is particularly suited for printing, for example, screen printing, inkjet printing, flexography printing, gravure printing, off-set printing, stamp printing, airbrushing, aerosol printing, typesetting, or any other method. The ink is uniquely optimizable for a variety of different printing techniques.

After deposition on the substrate, drying and decomposing the silver carboxylate within the non-conductive trace forms a conductive trace. Drying and decomposition may be accomplished by any suitable technique, where the techniques and conditions are guided by the type of substrate on which the traces are deposited and the type of silver carboxylate in the ink. For example, drying the ink and decomposing the silver carboxylate may be accomplished by heating (thermal, IR, microwave, etc.) and/or intense-pulsed light-based photonic sintering.

In one technique, heating the substrate dries and sinters the trace to form the conductive trace. Sintering decomposes the silver carboxylate to form conductive particles (for example nanoparticles) of the silver. It is an advantage that heating may be performed at a relatively high temperature range for longer periods of time without compromising mechanical properties of the conductive traces formed from the ink, which is particularly advantageous in applications where multiple layers of the ink must be deposited and processed, and in applications involving thermoforming of substrates.

Heating may be performed at a temperature of about 150° C. or higher, or 165° C. or higher, or 175° C. or higher, or 180° C. or higher, or 185° C. or higher, or 200° C. or higher, or 220° C. or higher, or 230° C. or higher, or 240° C. or higher while producing relatively highly conductive silver traces that have good mechanical properties. In one embodiment, the temperature is in a range of about 200° C. to about 250° C.

Heating is preferably performed for a time in a range of about 1-180 minutes, for example 5-120 minutes, or 5-60 minutes. Heating is performed at a sufficient balance between temperature and time to sinter the trace on the substrate to form a conductive trace. Improved thermal stability of the ink permits heating for longer periods of time, for example up to 1 hour or more. The type of heating apparatus also factors into the temperature and time required for sintering. Sintering may be performed with the substrate under an oxidizing atmosphere (e.g. air) or an inert atmosphere (e.g. nitrogen and/or argon gas).

In another technique, a photonic sintering system may feature a high intensity lamp (e.g. a pulsed xenon lamp) that delivers a broadband spectrum of light. The lamp may deliver about 5-27 J/cm$^2$ in energy to the traces. Pulse widths are preferably in a range of about 0.58-1.5 ms. Driving voltages are preferably in a range of about 1.6-3.0 kV. Photonic sintering may be performed under ambient conditions (e.g. in air). Photonic sintering is especially suited for polyethylene terephthalate and polyimide substrates.

A conductive trace formed by drying and sintering the ink on the substrate may be of any desired thickness and width. It is an advantage that the ink may be dried and sintered to form a conductive trace that is relatively thin and/or narrow, while maintaining relatively high conductivity (i.e. relatively low resistivity). The ink is well suited in applications where functional traces with linewidths ranging from about 50 µm to about 1000 µm are used in the same circuit. However, conductive traces may have width and/or thicknesses lower than 50 µm, enabling miniaturization of electronic circuits. In one embodiment, the ink enables uniform processing of traces with measured linewidths of about 3.5-23.0 mils with volume resistivity values ranging from 1.5-2.0 mΩ/□/mil capable of passing ASTM F1683-02 flex and crease testing, even following heating at 230° C. for up to one hour.

The substrate may be any suitable surface, especially printable surface. Suitable surfaces may include, for example polyethylene terephthalate (PET) (e.g. Melinex™), polyolefin (e.g. silica-filled polyolefin (Teslin™)), polydimethylsiloxane (PDMS), polystyrene, acrylonitrile/butadiene/styrene, polycarbonate, polyimide (e.g. Kapton™), thermoplastic polyurethane (TPU), silicone membranes, wool, silk, cotton, flax, jute, modal, bamboo, nylon, polyester, acrylic, aramid, spandex, polylactide, paper, glass, coated glass (e.g. ITO-coated glass), metal, dielectric coatings, among others.

The deposited conductive trace on the substrate may be incorporated into an electronic device, for example electrical circuits, conductive bus bars (e.g. for photovoltaic cells), sensors (e.g. touch sensors, wearable sensors), antennae (e.g. RFID antennae), thin film transistors, diodes, smart packaging (e.g. smart drug packaging), conformable inserts in equipment and/or vehicles, and multilayer circuits and MIM devices including low pass filters, frequency selective surfaces, transistors and antenna on conformable surfaces that can withstand high temperatures. The ink enables miniaturization of such electronic devices.

EXAMPLES

Example 1: Silver Neodecanoate Inks

Silver neodecanoate (AgND)-based inks were formulated as described in Table 1. Ink I1 was formulated in accordance with the present invention and Ink C1 is a comparative example of another formulation of AgND-based ink. The inks were prepared by combining all components and mixing in a plenary mixer until the solutions were homogenous. One of two polymeric binders was added in the inks: Rokrapol™ 7005 (a polyester) or ethyl cellulose 46 cP.

TABLE 1

| Ink Component | Ink I1 | Ink C1 |
|---|---|---|
| silver neodecanoate (wt %) | 60 | 52.1 |
| Rokrapol ™ 7075 (wt %) | 1.6 | / |
| ethylcellulose 46 cp (wt %) | / | 4.2 |
| terpineol (wt %) | 38.4 | / |
| octanol (wt %) | / | 12.0 |
| diethylbenzene (wt %) | / | 35.9 |

Figure 2A:
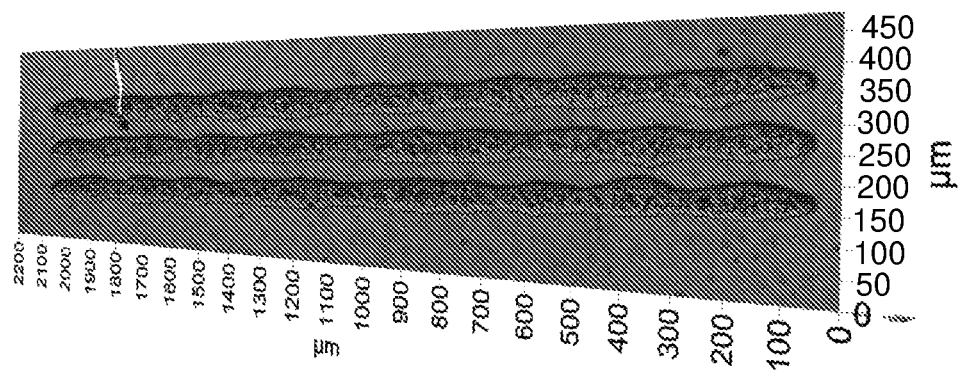
FIG. 2A and FIG. 2B depict a three dimensional profilometer image (FIG. 2A) and cross section analysis (FIG. 2B) of a trace screen-printed from a molecular ink of the present invention, which has been dried but not sintered. Note that the linewidths and line spacing of the printed trace are about 64±6 µm and about 34±1 µm, respectively.
Figure 2B:
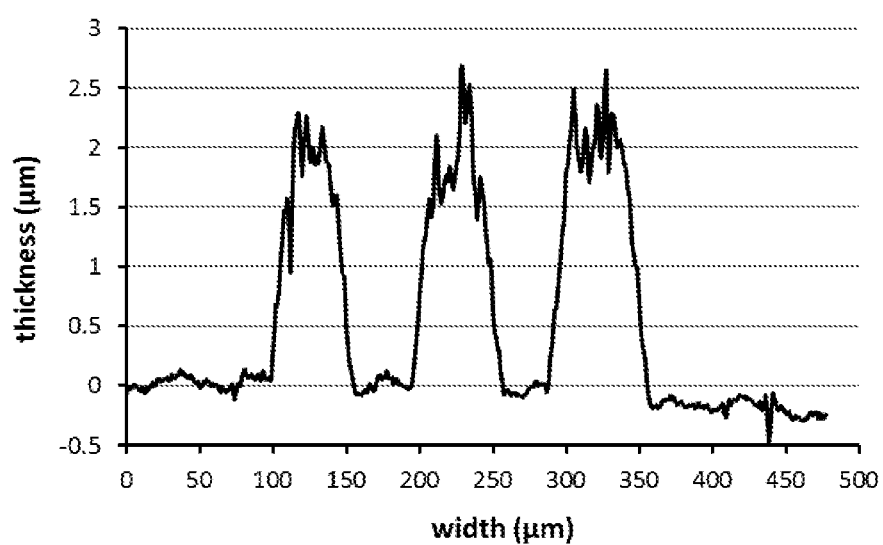
Figure 3A:
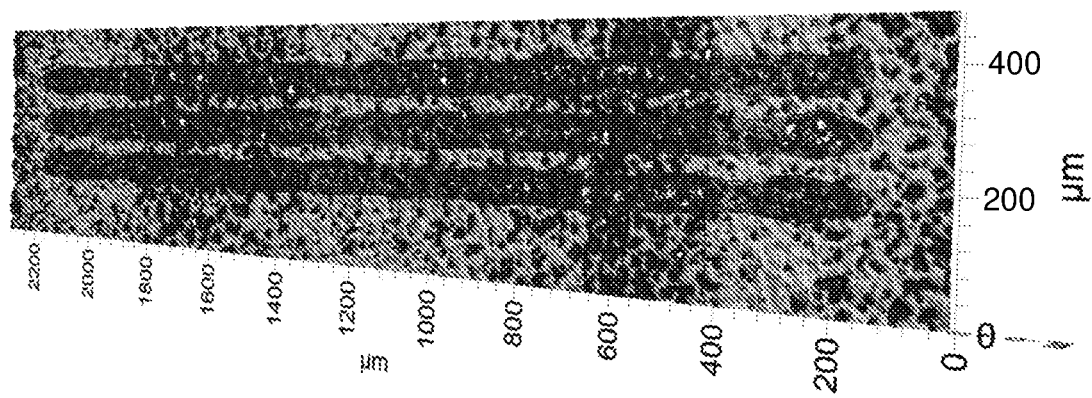
FIG. 3A and FIG. 3B depict a three dimensional profilometer image (FIG. 3A) and cross section analysis (FIG. 3B) of a trace screen-printed from a molecular ink of the present invention, which has been dried and sintered. Note that the linewidths and line spacing of the printed trace are about 70±5 µm and about 28±1 µm, respectively.
Figure 3B:
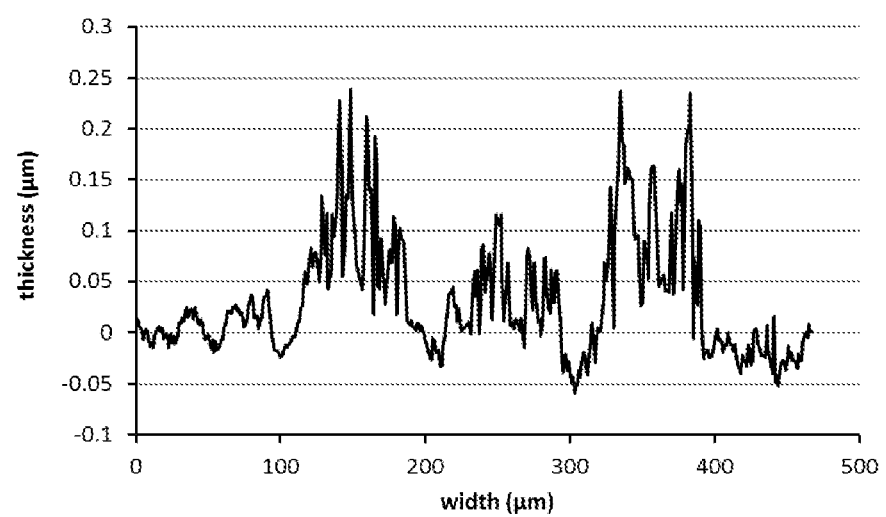

The inks were screen printed onto 8.5×11" sheets of Kapton™ HPP-ST using a screen with a mesh count of 400 (stainless steel screen with a 19 µm thread diameter and 45 µm mesh opening). As shown in FIGS. 2A and 2B (for printed and dried traces) and 3A and 3B (for printed, dried and sintered traces), Ink I1 is capable of producing traces with linewidths/line spacings of 64±6/34±1 µm for the dried traces and 70±5/28±1 µm for the dried and sintered traces, respectively. Screen printed lines 10 cm in length and nominal widths of 2-20 mil were also produced. These printed traces were thermally sintered in air at reflow temperatures (T) varying from ~140° C. to 240° C. using the heating programs described in Table 2. The temperatures quoted are those measured by a thermocouple attached to the Kapton™ substrate.

TABLE 2

| Zone | Front | Rear | Time, sec |
|---|---|---|---|
| Pre-heat 1 | 100° C. | 100° C. | 300 |
| Pre-heat 2 | 150° C. | 150° C. | 300 |
| Soak | 160° C. | 160° C. | 300 |
| Reflow | T | T | 3600 |
| Cool | 60° C. | 60° C. | 300 |

The electrical properties of the traces were characterized by measuring the resistance across the 10 cm long traces with an ohm meter. The widths and thickness of the sintered traces were measured using an optical profilometer (Cyber Technologies 3D Surface Profiler). The trace widths can be used to determine the number of squares in each 10-cm long trace, and subsequently used to calculate the sheet resistance. Using the thickness measurements, the sheet resistance values for the traces were calculated. The electrical properties of the sintered traces are provided in Table 3.

Figure 4:
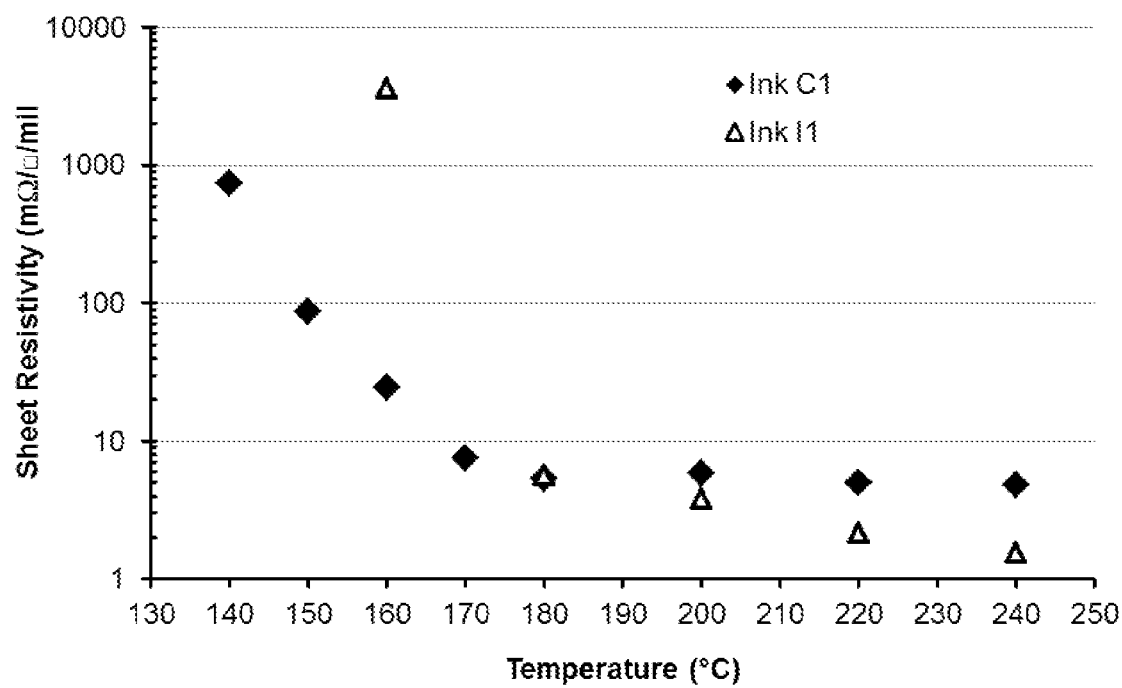
FIG. 4 depicts a graph of the sheet resistivity (mΩ/□/mil) as a function of sintering temperature (° C.) for a silver neodecanoate (AgND) ink of the present invention (Ink I1) compared another AgND ink having a different formulation (Ink C1).

It is evident from FIG. 4 that sintering about 21 mil traces produced from Ink C1 for 60 minutes can produce traces with lower sheet resistivity values in comparison to Ink I1 up to about 180° C. However, at temperatures higher than about 180° C. the traces produced from Ink C1 plateau with sheet resistivity values of about 5 mΩ/□/mil, whereas those produced from Ink I1 continue to decrease to about 1.5 mΩ/□/mil.

Figure 5:
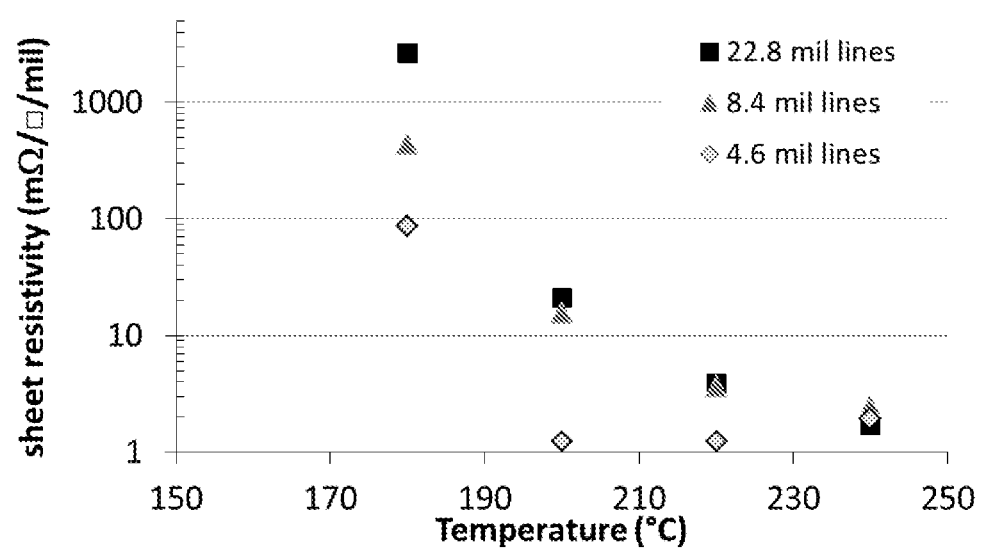
FIG. 5 depicts a plot of the sheet resistivity (mΩ/□/mil) vs. sintering temperature (° C.) for 4.6, 8.4 and 22.8 mil traces (measured linewidths) produced from Ink I1.

The sheet resistivity of the Ink I1 vs. sintering temperature was also determined for ink traces having linewidths in a range of 4.6-22.8 mil. The sintering temperatures ranged from 180° C. to 240° C. (substrate temperature) and the sintering times were 50 minutes. FIG. 5 illustrates the results. It is evident from FIG. 5 that the ink can provide very narrow conductive traces having very low sheet resistivity even when sintered at a temperature as high as 240° C. (see the 4.6 mil line in particular), and that for all linewidths, the resistivity of the sintered traces drops as the sintering temperature increases. The data illustrate the excellent thermal stability of Ink I1. At increasingly higher temperatures (>230° C.) for times greater than 20 minutes, the narrowest traces (linewidths less than about 3-4 mil), Ink C1 typically produces nonconductive traces.

Table 3 shows physical data (nominal and measured line widths and trace thicknesses) and electrical properties (sheet resistances and resistivity values) for 100 mm (100,000 μm) long screen printed traces having nominal linewidths from 2-20 mil produced from Ink I1 by sintering at 240° C. (substrate temperature) for 50 minutes in a batch reflow oven. It is evident from Table 3 that conductive traces produced by sintering Ink I1 at a relatively high temperature for a relatively long time have consistently very low resistivity over a wide range of linewidths, once again illustrating the excellent thermal stability of Ink I1.

TABLE 3

| Nominal line width (mil) | Ω | Line width (mil) | Line width (μm) | # of □ | mΩ/□ | Line thickness (μm) | mΩ/□/mil |
| --- | --- | --- | --- | --- | --- | --- | --- |
| 20 | 18.8 ± 1.0 | 23.1 ± 0.9 | 586.0 ± 24.0 | 172 ± 8 | 110 ± 12 | 0.54 ± 0.07 | 1.7 ± 0.2 |
| 15 | 25.0 ± 0.3 | 18.0 ± 0.2 | 456.7 ± 6.0 | 221 ± 2 | 113 ± 23 | 0.48 ± 0.06 | 2.1 ± 0.4 |
| 10 | 39.2 ± 2.4 | 12.9 ± 0.3 | 326.7 ± 8.6 | 307 ± 3 | 128 ± 28 | 0.39 ± 0.08 | 1.9 ± 0.4 |
| 5 | 85.2 ± 2.7 | 8.0 ± 1.2 | 202.3 ± 30.8 | 497 ± 12 | 172 ± 28 | 0.32 ± 0.08 | 2.4 ± 0.4 |
| 3 | 157.6 ± 2.1 | 5.5 ± 1.5 | 147.4 ± 37.4 | 685 ± 15 | 350 ± 28 | 0.20 ± 0.08 | 2.3 ± 0.4 |
| 2 | 263.2 ± 1.9 | 4.6 ± 1.4 | 117.8 ± 35.9 | 852 ± 14 | 309 ± 11 | 0.19 ± 0.05 | 2.4 ± 0.1 |

Bend a crease testing in accordance with ASTM F1683-09 was performed on traces produced by sintering Ink I1 at 240-245° C. for 50 minutes. The results are shown in Table 4. It is evident from Table 4 that resistance does not increase by more than 5% following any of the tests.

TABLE 4

| | Line width (mil) | % change in resistance following bend test, tensile | % change in resistance following bend test, compressive | % change in resistance following crease test, tensile | % change in resistance following crease test, compressive | # of lines tested |
| --- | --- | --- | --- | --- | --- | --- |
| Avg. | 23.1 | 1.0 | 2.6 | 0.5 | 4.9 | 35 |
| SD | 0.9 | 1.7 | 2.6 | 1.9 | 3.2 | |
| Avg. | 18 | 0.9 | 2.8 | 0.7 | 4.0 | 35 |
| SD | 0.2 | 1.6 | 2.5 | 1.2 | 2.5 | |
| Avg. | 12.9 | 2.2 | 3.1 | 0.5 | 3.3 | 35 |
| SD | 0.3 | 1.5 | 2.9 | 1.1 | 2.8 | |
| Avg. | 8 | 2.4 | 3.3 | 1.1 | 2.6 | 34 |
| SD | 1.2 | 1.4 | 1.8 | 1.3 | 1.8 | |
| Avg. | 5.8 | 3.5 | 4.5 | 1.0 | 2.1 | 20 |
| SD | 1.5 | 2.0 | 2.4 | 0.6 | 0.7 | |
| Avg. | 4.6 | 1.1 | 2.2 | 0.9 | 1.1 | 5 |
| SD | 1.4 | 0.3 | 0.4 | 0.2 | 0.2 | |

Avg. = Average;
SD = standard deviation

Crease testing in accordance with ASTM F1683-09 was performed on traces produced by sintering Ink C1 and Ink I1 at 240° C. for 30 minutes. FIG. 6A are photographs showing the results for Ink C1 and FIG. 6B are photographs showing the results for Ink I1. Photographs (ii) and (iii) in each of FIG. 6A and FIG. 6B are magnified views of respective photograph (i). As best seen in the magnified views (ii) and (iii) for FIG. 6A and FIG. 6B, the traces containing cellulose-based polymers are cracked/broken (FIG. 6A(ii) and FIG. 6A(iii), whereas the traces containing Rokrapol™ 7075 remain unaffected by creasing (FIG. 6B(ii) and FIG. 6B(iii)).

Adhesion tests were performed using scotch tape on traces produced by sintering Ink C1 and Ink I1 at 240° C. for 30 minutes. FIG. 7A are photographs showing the results for Ink C1 and FIG. 7B are photographs showing the results for Ink I1. Photograph (i) in each of FIG. 7A and FIG. 7B show the traces with the scotch tape applied. Photograph (ii) in each of FIG. 7A and FIG. 7B show the traces after the scotch tape has been removed. As seen in FIG. 7A(ii), a significant amount of the trace is removed when cellulose-based polymer (Ink C1) is used to produce the trace. In contrast, as seen in FIG. 7B(ii), no detectable amount of the trace is removed when Rokrapol™ 7050 (Ink I1) is used to produce the trace.

The novel features will become apparent to those of skill in the art upon examination of the description. It should be understood, however, that the scope of the claims should not be limited by the embodiments, but should be given the broadest interpretation consistent with the wording of the claims and the specification as a whole.

The invention claimed is:

1. A molecular ink comprising: a silver carboxylate; a solvent comprising a terpineol; and, a polymeric binder comprising a hydroxyl-and/or carboxyl-terminated polyester wherein the silver carboxylate comprises silver neodecanoate and is in the ink in an amount that provides a silver loading in the ink of about 24 wt % or more, based on total weight of the ink, the ink having a viscosity in a range of 31,000 cp to 180,000 cp and the ink providing a conductive trace on a substrate that exhibits less than 10% change in resistance following flexing and creasing in accordance with ASTM F1683-09 following exposure to temperatures greater than 230° C., wherein the ink is a shear thinning paste at room temperature.

2. The ink according to claim 1, wherein the silver neodecanoate is present in the ink in an amount of about 60 wt % or more, based on total weight of the ink.

3. The ink according to claim 1, wherein the silver neodecanoate is present in the ink in an amount of about 80 wt % or more, based on total weight of the ink.

4. The ink according to claim 1, wherein the polymeric binder is present in an amount of about 0.5 wt % to about 3 wt %, based on total weight of the ink.

5. The ink according to claim 1, wherein the solvent comprises a-terpineol.

6. The ink according to claim 1, wherein the solvent is in the ink in an amount in a range of about 1 wt % to about 50 wt %, based on total weight of the ink.

7. The ink according to claim 1, wherein the solvent is in the ink in an amount in a range of about 10 wt % to about 40 wt %, based on total weight of the ink.

8. The ink according to claim 1, wherein the hydroxyl- and/or carboxyl-terminated polyester is a carboxyl-terminated polyester.

9. The ink according to claim 8, wherein the carboxyl-terminated polyester is present in an amount of about 1 wt % to about 2 wt %, based on total weight of the ink.

10. The ink according to claim 8, wherein the carboxyl-terminated polyester comprises Rokrapol™ 7075.

11. The ink according to claim 1, wherein the ink is a homogeneous solution during mixing in a plenary mixer.

12. A process for producing a conductive silver trace on a substrate, the process comprising depositing an ink as defined in claim 1 onto a substrate to form a non-conductive trace of the ink on the substrate, and sintering the non-conductive trace of the ink on the substrate to form the conductive silver trace.

13. The process according to claim 12, wherein the sintering is performed at a temperature of about 180° C. or higher.

14. The process according to claim 12, wherein the sintering is performed for a time in a range of about 1 minute to 180 minutes.

15. The process according to claim 12, wherein the substrate comprises polyethylene terephthalate, polyolefin, polydimethylsiloxane, polystyrene, acrylonitrile/butadiene/styrene, polycarbonate, polyimide, thermoplastic polyurethane, a silicone membrane, wool, silk, cotton, flax, jute, modal, bamboo, nylon, polyester, acrylic, aramid, spandex, polylactide, paper, glass, metal or a dielectric coating.

16. The process according to claim 12, wherein the depositing comprises printing.

17. The process according to claim 16, wherein the printing comprises screen printing.

* * * * *

UNITED STATES PATENT AND TRADEMARK OFFICE
CERTIFICATE OF CORRECTION

| | | |
|---|---|---|
| PATENT NO. | : 11,472,980 B2 | Page 1 of 1 |
| APPLICATION NO. | : 16/483262 | |
| DATED | : October 18, 2022 | |
| INVENTOR(S) | : Arnold J. Kell et al. | |

It is certified that error appears in the above-identified patent and that said Letters Patent is hereby corrected as shown below:

In the Specification

Column 1, Line 7, the date 'Feb. 18, 2019' should read -Feb. 18, 2018-.

Signed and Sealed this
Fifteenth Day of August, 2023

*Katherine Kelly Vidal*

Katherine Kelly Vidal
*Director of the United States Patent and Trademark Office*